(12) United States Patent
Blin et al.

(10) Patent No.: US 12,525,492 B2
(45) Date of Patent: Jan. 13, 2026

(54) SEMICONDUCTOR WAFER WITH PROBE PADS LOCATED IN SAW STREET

(71) Applicant: Skyworks Solutions, Inc., Irvine, CA (US)

(72) Inventors: Guillaume Alexandre Blin, Carlisle, MA (US); Engin Ibrahim Pehlivanoglu, Costa Mesa, CA (US)

(73) Assignee: Skyworks Solutions, Inc., Irvine, CA (US)

(*) Notice: Subject to any disclaimer, the term of this patent is extended or adjusted under 35 U.S.C. 154(b) by 384 days.

(21) Appl. No.: 18/104,977

(22) Filed: Feb. 2, 2023

(65) Prior Publication Data

US 2023/0282529 A1 Sep. 7, 2023

Related U.S. Application Data

(60) Provisional application No. 63/306,899, filed on Feb. 4, 2022, provisional application No. 63/306,880, filed on Feb. 4, 2022, provisional application No. 63/306,895, filed on Feb. 4, 2022, provisional application No. 63/306,926, filed on Feb. 4, 2022.

(51) Int. Cl.

| | |
|---|---|
| *H01L 25/065* | (2023.01) |
| *G01R 1/073* | (2006.01) |
| *G01R 31/26* | (2020.01) |
| *G01R 31/28* | (2006.01) |
| *H01L 21/66* | (2006.01) |
| *H01L 23/48* | (2006.01) |
| *H01L 23/525* | (2006.01) |
| *H01L 23/58* | (2006.01) |
| *H10B 20/25* | (2023.01) |

(52) U.S. Cl.
CPC .......... *H01L 22/32* (2013.01); *G01R 1/07342* (2013.01); *G01R 31/2601* (2013.01); *G01R 31/2884* (2013.01); *H01L 22/14* (2013.01); *H01L 22/20* (2013.01); *H01L 22/34* (2013.01); *H01L 23/481* (2013.01); *H01L 23/585* (2013.01); *H01L 25/0655* (2013.01); *H01L 23/5256* (2013.01); *H10B 20/25* (2023.02)

(58) Field of Classification Search
CPC ......... H01L 22/32; H01L 21/78; H01L 22/22; H01L 23/562
See application file for complete search history.

(56) References Cited

U.S. PATENT DOCUMENTS

| | | | | |
|---|---|---|---|---|
| 4,903,111 A | * | 2/1990 | Takemae | G11C 29/785 365/96 |
| 5,389,556 A | * | 2/1995 | Rostoker | G01R 31/2884 324/750.05 |
| 5,648,661 A | * | 7/1997 | Rostoker | G11C 29/006 257/665 |

(Continued)

*Primary Examiner* — Evren Seven
(74) *Attorney, Agent, or Firm* — Knobbe, Martens, Olson & Bear, LLP

(57) ABSTRACT

A semiconductor wafer comprising a first die including a first integrated circuit having a trimmable or programmable component. The trimmable or programmable component is configured to be trimmed or permanently altered in response to an electrical signal. The semiconductor wafer also includes a saw street arranged adjacent to the first die, and at least one probe pad electrically connected to the trimmable or programmable component. The at least one probe pad is arranged in the saw street.

20 Claims, 9 Drawing Sheets

(56) References Cited

U.S. PATENT DOCUMENTS

| | | | |
|---|---|---|---|
| 6,121,677 A * | 9/2000 | Song | H01L 24/02 257/692 |
| 6,492,666 B2 * | 12/2002 | Terada | H01L 22/32 257/209 |
| 7,563,694 B2 * | 7/2009 | Burnside | H01L 22/32 438/113 |
| 8,378,346 B2 * | 2/2013 | Pagani | H01L 22/32 257/E21.531 |
| 8,532,602 B2 | 9/2013 | Pehlivanoglu et al. | |
| 8,922,268 B2 | 12/2014 | Madan et al. | |
| 8,975,950 B2 | 3/2015 | Madan et al. | |
| 9,013,225 B2 | 4/2015 | Madan et al. | |
| 9,048,786 B2 | 6/2015 | Pehlivanoglu et al. | |
| 9,148,194 B2 | 9/2015 | Madan et al. | |
| 9,160,328 B2 | 10/2015 | Altunkilic et al. | |
| 9,246,437 B2 | 1/2016 | Pehlivanoglu et al. | |
| 9,276,570 B2 | 3/2016 | Madan et al. | |
| 9,450,579 B2 | 9/2016 | Madan et al. | |
| 9,495,631 B1 * | 11/2016 | Koepp | G06K 19/07752 |
| 9,509,363 B2 | 11/2016 | Madan et al. | |
| 9,620,424 B2 | 4/2017 | Blin et al. | |
| 9,628,075 B2 | 4/2017 | Cebi et al. | |
| 9,685,943 B2 | 6/2017 | Madan et al. | |
| 9,721,936 B2 | 8/2017 | Zhu et al. | |
| 9,741,653 B2 | 8/2017 | Roy et al. | |
| 9,837,324 B2 | 12/2017 | Blin et al. | |
| 9,852,978 B2 | 12/2017 | Roy et al. | |
| 9,923,594 B2 | 3/2018 | Madan et al. | |
| 9,973,184 B2 | 5/2018 | Madan et al. | |
| 10,032,731 B2 | 7/2018 | Fuh et al. | |
| 10,050,653 B2 | 8/2018 | Pehlivanoglu et al. | |
| 10,056,901 B2 | 8/2018 | Roy et al. | |
| 10,103,495 B2 | 10/2018 | Blin et al. | |
| 10,147,724 B2 | 12/2018 | Madan et al. | |
| 10,171,045 B2 | 1/2019 | Pehlivanoglu et al. | |
| 10,229,902 B2 | 3/2019 | Zhu et al. | |
| 10,230,332 B2 | 3/2019 | Pehlivanoglu et al. | |
| 10,255,982 B2 | 4/2019 | Zhou et al. | |
| 10,284,200 B2 | 5/2019 | Roy et al. | |
| 10,340,861 B2 | 7/2019 | Ye et al. | |
| 10,347,350 B2 | 7/2019 | Zhou et al. | |
| 10,360,988 B2 | 7/2019 | Zhou et al. | |
| 10,437,774 B2 | 10/2019 | Obkircher et al. | |
| 10,447,151 B2 | 10/2019 | Zhou et al. | |
| 10,490,294 B2 | 11/2019 | Zhou et al. | |
| 10,498,319 B2 | 12/2019 | Zhou et al. | |
| 10,541,682 B2 | 1/2020 | Popplewell et al. | |
| 10,580,705 B2 | 3/2020 | Blin et al. | |
| 10,615,756 B2 | 4/2020 | Pehlivanoglu et al. | |
| 10,637,412 B2 | 4/2020 | Ye et al. | |
| 10,643,727 B2 | 5/2020 | Zhou et al. | |
| 10,693,459 B2 | 6/2020 | Blin et al. | |
| 10,700,063 B2 | 6/2020 | Blin et al. | |
| 10,826,546 B2 | 11/2020 | Pehlivanoglu et al. | |
| 10,840,233 B2 | 11/2020 | Zhu et al. | |
| 10,880,116 B2 | 12/2020 | Zhou et al. | |
| 10,886,880 B2 | 1/2021 | Pehlivanoglu et al. | |
| 10,963,418 B2 | 3/2021 | Obkircher et al. | |
| 11,038,096 B2 | 6/2021 | Modi et al. | |
| 11,043,432 B2 | 6/2021 | Blin et al. | |
| 11,056,210 B1 | 7/2021 | Laisne et al. | |
| 11,115,015 B2 | 9/2021 | Zhou et al. | |
| 11,159,158 B2 | 10/2021 | Popplewell et al. | |
| 11,217,581 B2 | 1/2022 | Blin et al. | |
| 11,289,432 B2 | 3/2022 | Fuh et al. | |
| 11,296,688 B2 | 4/2022 | Blin et al. | |
| 11,303,253 B2 | 4/2022 | Pehlivanoglu et al. | |
| 11,314,685 B2 | 4/2022 | Obkircher et al. | |
| 11,316,550 B2 | 4/2022 | Liang et al. | |
| 11,329,609 B2 | 5/2022 | Johnson et al. | |
| 11,394,384 B2 | 7/2022 | Blin et al. | |
| 11,444,026 B2 | 9/2022 | Zhou et al. | |
| 11,539,288 B2 | 12/2022 | Zhou et al. | |
| 11,664,839 B2 | 5/2023 | Pehlivanoglu et al. | |
| 11,671,136 B2 | 6/2023 | Liang et al. | |
| 11,682,699 B2 | 6/2023 | Roy et al. | |
| 11,785,853 B2 | 10/2023 | Modi et al. | |
| 11,810,874 B2 | 11/2023 | Fuh et al. | |
| 11,811,438 B2 | 11/2023 | Nisbet et al. | |
| 11,817,456 B2 | 11/2023 | Blin et al. | |
| 11,901,243 B2 | 2/2024 | Blin et al. | |
| 11,916,303 B2 | 2/2024 | Kovacic et al. | |
| 11,916,518 B2 | 2/2024 | Johnson et al. | |
| 11,936,416 B2 | 3/2024 | Liang et al. | |
| 11,942,682 B2 | 3/2024 | Kovacic et al. | |
| 11,942,861 B2 | 3/2024 | Zhou et al. | |
| 11,953,926 B2 | 4/2024 | Liang et al. | |
| 11,967,896 B2 | 4/2024 | Blin et al. | |
| 11,973,115 B2 | 4/2024 | Roy et al. | |
| 2003/0062591 A1 * | 4/2003 | Jensen | H01L 23/5256 257/E23.149 |
| 2005/0239268 A1 * | 10/2005 | Pirkle | H01L 21/78 438/460 |
| 2005/0248000 A1 * | 11/2005 | Chen | H01L 22/32 257/620 |
| 2007/0243643 A1 * | 10/2007 | Rolda, Jr. | H01L 22/32 438/18 |
| 2009/0140391 A1 * | 6/2009 | Hou | H01L 23/585 257/E23.18 |
| 2010/0084751 A1 * | 4/2010 | Frederick, Jr. | H01L 23/585 257/E23.18 |
| 2010/0085107 A1 * | 4/2010 | Huang | H01H 85/30 327/525 |
| 2012/0313690 A1 | 12/2012 | Hall et al. | |
| 2012/0326146 A1 * | 12/2012 | Hui | H01L 22/32 257/E29.325 |
| 2013/0020674 A1 * | 1/2013 | Leal | H01L 23/585 257/E23.149 |
| 2013/0026466 A1 * | 1/2013 | Pagani | H01L 24/05 257/E23.179 |
| 2013/0037968 A1 * | 2/2013 | Ishida | H01L 23/564 257/E23.179 |
| 2014/0009210 A1 | 1/2014 | Madan et al. | |
| 2014/0009212 A1 | 1/2014 | Altunkilic et al. | |
| 2014/0015111 A1 * | 1/2014 | Ho | H01L 23/3185 257/620 |
| 2014/0077320 A1 * | 3/2014 | Chen | H01L 23/585 257/E23.179 |
| 2015/0171860 A1 | 6/2015 | Blin et al. | |
| 2016/0126199 A1 | 5/2016 | Roy et al. | |
| 2017/0082684 A1 * | 3/2017 | Pagani | H01L 22/34 |
| 2018/0062582 A1 | 3/2018 | Pehlivanoglu et al. | |
| 2018/0122754 A1 * | 5/2018 | Tatour | H01L 23/585 |
| 2018/0180665 A1 | 6/2018 | Delacruz et al. | |
| 2018/0315723 A1 * | 11/2018 | Singh | H01L 24/06 |
| 2019/0107575 A1 * | 4/2019 | Pagani | H01L 24/05 |
| 2019/0158028 A1 | 5/2019 | Pehlivanoglu | |
| 2019/0180833 A1 | 6/2019 | Zhou et al. | |
| 2019/0181063 A1 * | 6/2019 | Liao | H01L 23/544 |
| 2019/0253054 A1 | 8/2019 | Roy et al. | |
| 2019/0304967 A1 | 10/2019 | Chang et al. | |
| 2019/0386005 A1 | 12/2019 | Madan et al. | |
| 2019/0386104 A1 | 12/2019 | Roy et al. | |
| 2021/0203322 A1 | 7/2021 | Blin et al. | |
| 2021/0348684 A1 * | 11/2021 | Yao | H01L 23/562 |
| 2022/0013415 A1 | 1/2022 | Blin et al. | |
| 2022/0254812 A1 | 8/2022 | Wang et al. | |
| 2022/0321151 A1 | 10/2022 | Zhu et al. | |
| 2022/0344833 A1 | 10/2022 | Blin et al. | |
| 2022/0345172 A1 | 10/2022 | Blin et al. | |
| 2022/0352888 A1 | 11/2022 | Blin et al. | |
| 2022/0385249 A1 | 12/2022 | Brunel et al. | |
| 2022/0413533 A1 | 12/2022 | Liang et al. | |
| 2022/0416084 A1 | 12/2022 | Ye et al. | |
| 2023/0009677 A1 | 1/2023 | Wang et al. | |
| 2023/0012894 A1 | 1/2023 | Liang et al. | |
| 2023/0014555 A1 | 1/2023 | Liang et al. | |
| 2023/0038733 A1 | 2/2023 | Blin et al. | |
| 2023/0066905 A1 | 3/2023 | Huang et al. | |
| 2023/0085532 A1 | 3/2023 | Zhou et al. | |
| 2023/0100609 A1 | 3/2023 | Liang et al. | |
| 2023/0107607 A1 | 4/2023 | Nisbet et al. | |

(56) References Cited

U.S. PATENT DOCUMENTS

| | | |
|---|---|---|
| 2023/0187289 A1* | 6/2023 | Momota ............. H01L 23/5256 |
| | | 257/48 |
| 2023/0208044 A1 | 6/2023 | Brunel et al. |
| 2023/0238385 A1 | 7/2023 | Wang et al. |
| 2023/0253270 A1 | 8/2023 | Blin et al. |
| 2023/0253271 A1 | 8/2023 | Blin et al. |
| 2023/0253991 A1 | 8/2023 | Blin et al. |
| 2023/0280372 A1 | 9/2023 | Blin et al. |
| 2023/0361055 A1* | 11/2023 | Chen ..................... H01L 23/585 |
| 2023/0361113 A1 | 11/2023 | Lam et al. |
| 2023/0420332 A1 | 12/2023 | Blin et al. |
| 2024/0038865 A1 | 2/2024 | Blin et al. |
| 2024/0039531 A1 | 2/2024 | Blin et al. |
| 2024/0056056 A1 | 2/2024 | Blin et al. |
| 2024/0079314 A1 | 3/2024 | Wang et al. |
| 2024/0113051 A1 | 4/2024 | Blin et al. |
| 2024/0113168 A1 | 4/2024 | Blin |
| 2024/0113169 A1 | 4/2024 | Blin |
| 2024/0113170 A1 | 4/2024 | Blin |
| 2024/0113180 A1 | 4/2024 | Blin |
| 2024/0113181 A1 | 4/2024 | Blin |
| 2024/0113190 A1 | 4/2024 | Blin et al. |
| 2024/0113735 A1 | 4/2024 | Nisbet et al. |
| 2024/0114794 A1 | 4/2024 | Modi et al. |
| 2024/0153891 A1 | 5/2024 | Fuh et al. |
| 2024/0153946 A1 | 5/2024 | Blin et al. |
| 2024/0363454 A1* | 10/2024 | Yang ....................... H01L 21/78 |
| 2025/0054818 A1 | 2/2025 | Ogawa et al. |

\* cited by examiner

SEMICONDUCTOR WAFER WITH PROBE PADS LOCATED IN SAW STREET

INCORPORATION BY REFERENCE TO ANY PRIORITY APPLICATIONS

Any and all applications, if any, for which a foreign or domestic priority claim is identified in the Application Data Sheet of the present application are hereby incorporated by reference under 37 CFR 1.57.

BACKGROUND

Field

Embodiments of the invention relate to the testing and trimming of integrated circuits on semiconductor wafers.

Description of the Related Technology

In semiconductor manufacture, dies are formed on semiconductor wafers using a reticle. A reticle comprises a transparent substrate on which a patterned opaque coating is formed to define an image which is to be projected on to the wafer. The image contains one or more dies and each die includes a primary die area that is patterned according to an integrated circuit design. The reticle is placed into a projection system and exposed to radiation, such as ultraviolet light, to project the image on to an area of the wafer. The area of the wafer on to which the image of the reticle is projected is called the field area. Multiple field areas can be formed adjacent to one another by stepping the reticle across the wafer. Multiple patterned processing layers can be added to the wafer to form an integrated circuit within each die on the wafer.

A semiconductor device or package may be fully assembled, or substantially fully assembled, whilst the integrated circuit is still part of the wafer, that is, before the wafer is diced into separate devices each comprising a single die. Such a package may be referred to as a wafer-level chip-scale package (WLCSP). The term "chip-scale package" refers to the fact that the semiconductor package is substantially the same size as, or only marginally larger than, the size of the die. To form a WLCSP, all necessary components are added to the die on the wafer. Such components may include electrical interconnects, additional circuitry, redistribution layers, etc. Contact pads are added for each die to provide electrical connection to the integrated circuit and solder bumps may be added to the contact pads to facilitate connections to printed circuit boards or other packages. A packaging structure is also added to provide protection and/or facilitate easier handling of the semiconductor device. Such a packaging structure can include an overmold structure formed over the wafer.

FIG. 1 is a schematic illustration of part of a known wafer arrangement in which sixteen semiconductor devices 2 have been formed on a wafer 4 in a 4×4 grid or matrix. Only the outline of the die 6 of each of the semiconductor devices 2 and the contact pads 8 for electrically connecting to the integrated circuit of each die are shown. Other components of the semiconductor devices 2 have been omitted for clarity. Four contact pads 8 per die 6 are shown but it will be appreciated that a different number of contact pads may be present depending on the nature of the integrated circuit to which they connect. The dies 6 are part of a single field area 10 of a reticle that has been projected on to the wafer 4. Although FIG. 1 shows only sixteen dies 6 within the field area 10, it will be appreciated that the field area 10 may contain hundreds of dies. Between the columns and rows of dies 6 are gaps called scribe lines or saw streets 12 along which the wafer 4 is cut or diced to separate the wafer 4 into individual semiconductor devices 2 such that each semiconductor device has its own die 6 and integrated circuit (not shown). Two saw streets 12 have been highlighted with stippled shading in FIG. 1 but it will be appreciated that a saw street 12 extends between all the columns and rows of the matrix of dies 6 such that each die 6 can be separated.

During the manufacture of integrated circuits, variations in the manufacturing process can result in variations in the electrical characteristics of the circuit. If the variation is outside permitted tolerances it can adversely affect the operation of the integrated circuit and reduce the device yield from the wafer. It is therefore important to test for such variations, for example, by probing the wafer at various points during its manufacture. To avoid testing the actual integrated circuits themselves, which may be damaged by probing, test structures or process control monitoring structures are typically formed on a wafer and are included in the image on the reticle. The test structures include some or all of the processing layers used to form the integrated circuit and can be electrically measured to determine variations in electrical characteristics.

A technique known as trimming can be used to compensate for process variations. After circuit manufacture, various components of the integrated circuit are adjusted, or trimmed, to bring the electrical characteristics within permitted tolerances. For example, trimming can be used to adjust resistances or capacitances, to adjust transconductance values, and to correct for DC offsets resulting from variations in the manufacturing process.

One method of trimming the integrated circuit makes use of fuse circuitry, which is incorporated into the integrated circuit. By probing the test structures during wafer testing, the need for trimming can be identified. Selected fuses are then blown to make the necessary adjustments to the integrated circuit.

Fuse circuits used for device trimming may require dedicated fuse probe pads which are electrically connected to the fuse circuitry. Further pads may also be required to power and control the fuse circuitry. A probe can be applied to a probe pad and an electrical current supplied in order to blow a selected fuse. Probes for testing the wafer are usually provided as part of a probe card having an area covering the area of the wafer to be tested or trimmed and generally cover one or more dies. The probes are provided at locations on the probe card corresponding to the locations of probe pads on the wafer so that when the probe card is used to test the wafer the probes are aligned with the probe pads.

Conventionally, probe pads were provided within the area of each die. However, due to advances in the semiconductor industry, the size of integrated circuits has decreased significantly, and dies have become so small that there is no longer space to accommodate probe pads for testing and trimming the integrated circuits. As can be seen from FIG. 1, there are no probe pads provided within the area of the dies 6 because the dies are two small to accommodate them. Given that the probe pads are only used during testing and trimming, any area of a die provided to accommodate probe pads would be redundant once the testing and trimming procedure is complete and would increase the size of dies for no further benefit.

Some solutions have been proposed which use laser trimming capabilities for trimming semiconductor devices. However, these are costly in terms of die area and test time.

Consequently, trimming is often not performed, which means that semiconductor devices may have integrated circuits with electrical characteristics that do not fall within permitted tolerances. Such devices are rejected at the final quality control test stage, which reduces device yield.

Test structures or process control monitoring structures for wafer testing also need to be accommodated on the wafer and these features are typically included in the scribe lines or saw streets between individual die. However, due to the drive to increase the device yield from a single wafer, there has been an increase in the number of dies on the wafer. This has been achieved through smaller die sizes but also through a reduction in the width of the saw streets between adjacent dies. Consequently, test structures or process control monitoring structures are typically too large to fit within the saw streets.

A previously proposed solution to address the issue of test structures being too large to fit within the saw streets was to take one die within a group of dies on a wafer, for example, within a reticle field area, and use it as a dedicated test die by placing all the test structures within this one die. Such a test die may be referred to as a steal primary die.

FIGS. 2A and 2B are schematic illustrations of parts of two known wafer arrangements in which reticle field areas each utilize a steal primary die for wafer testing and trimming. The wafer arrangement of FIG. 2A is similar to that of FIG. 1 and has a reticle field area 10 comprising sixteen dies 6 arranged in a 4×4 matrix. A single die 6a in the top left-hand corner of the field area 10 has been utilized as a steal primary die, into which test structures 14 have been placed. The steal primary die 6a includes the test structures or process control monitor structures for testing that the wafer has been manufactured in accordance with the required specification.

FIG. 2B shows a reticle field area 10 of a wafer 4 having a similar construction to that of FIG. 2A with the exception that the reticle field area 10 comprises multiple steal primary dies 6a, 6b to accommodate all test structures or process control monitor structures required. As can be seen in FIG. 2B, two dies 6a and 6b in the top left-hand corner of the field area 10 have been utilized as steal primary dies, into which test structures 14 have been placed.

A disadvantage of using a steal primary die to enable trimming, as in the arrangements of FIGS. 2A and 2B, is that there is a reduction in device yield due to the steal primary dies 6a, 6b occupying wafer area which could otherwise be used for an operational die. Another disadvantage is that the steal primary die 6a is required to enable all of the dies 6 to be tested on the reticle. Alternatively, a smaller probe card can be used covering just a subset of the dies 6 within a reticle field area but this requires the reticle field area to have multiple steal primary dies, i.e. one for each area covered by the probe card.

SUMMARY

According to one embodiment, there is provided a semiconductor wafer comprising a first die including a first integrated circuit having a trimmable or programmable component. The trimmable or programmable component is configured to be trimmed or permanently altered in response to an electrical signal. The semiconductor wafer also includes at least one probe pad electrically connected to the trimmable or programmable component. The at least one probe pad is arranged outside of the first die.

According to another embodiment, there is provided a semiconductor wafer comprising a first die including a first integrated circuit having a trimmable or programmable component. The trimmable or programmable component is configured to be trimmed or permanently altered in response to an electrical signal. The semiconductor wafer also includes a saw street arranged adjacent to the first die, and at least one probe pad electrically connected to the trimmable or programmable component. The at least one probe pad is arranged in the saw street.

In one example, the semiconductor wafer of claim 1 may further include a second die. The first and second dies may be separated by the saw street.

In one example, the at least one probe pad may be electrically connected to the trimmable or programmable component by a conductor extending from the at least one probe pad to the trimmable or programmable component.

In one example, the trimmable or programmable component may be a fuse or a one-time programmable device.

In one example, the trimmable component may be a device that changes its properties in a continuous fashion depending on the electrical or thermal conditions applied to it during trimming.

In one example, the trimmable or programmable component may be a memory.

A direct connection between the trimmable or programmable component and the at least one probe pad is not required. In one example, the trimmable component may be connected to the at least one probe pad via trimming control circuitry configured to control the trimming of the trimmable component. The trimming control circuitry may be arranged in the saw street. The trimmable or programmable component may be powered by the regular contact pads of the die.

In one example, the trimming circuitry may include a sensing circuit configured to detect whether a fuse has been blown.

In one example, the first integrated circuit may further include a plurality of trimmable or programmable components. The semiconductor wafer may further include a plurality of probe pads. Each probe pad may be electrically connected to a respective trimmable or programmable component.

In one example, the plurality of probe pads may be located in the saw street.

In one example, the semiconductor wafer may further include a seal ring arranged around the first integrated circuit. The seal ring may be arranged between the first integrated circuit and a perimeter of the first die.

In one example, the conductor electrically connecting the at least one probe pad to the trimmable component may extend through the seal ring.

In one example, the seal ring may be continuous.

In one example, the seal ring may be segmented.

In one example, the conductor may extend through a gap between two segments of the segmented seal ring.

In one example, the seal ring may be electrically isolated from other components of the wafer.

In one example, the seal ring may comprise a metal layer.

In one example, the seal ring may comprise a plurality of stacked metal layers. The number of metal layers in the plurality of stacked metal layers may be in the range from two to tens of layers.

In one example, the conductor may pass through a gap formed in an intermediate layer of the plurality of stacked metal layers, the intermediate layer being between a top and bottom layer of the stacked metal layers.

In one example, the conductor may pass through a gap formed in the top layer of the plurality of stacked metal layers.

In one example, the conductor may pass through a gap formed through all the layers of the plurality of stacked metal layers.

In one example, the conductor may form part of a redistribution layer arranged over the seal ring.

In one example, the semiconductor wafer may further include a plurality of dies separated by at least one saw street. The semiconductor wafer may further include a plurality of probe pads. The plurality of probe pads may be arranged in the at least one saw street. Each die of the plurality of dies may include an integrated circuit having at least one trimmable or programmable component. At least one probe pad of the plurality of probe pads may be electrically connected to the at least one trimmable or programmable component of more than one die.

In one example, the at least one probe pad of the plurality of probe pads may be electrically connected to the at least one trimmable or programmable component of more than one die by a plurality of conductors.

In one example, at least a portion of the plurality of conductors may extend along the at least one saw street to interconnect each die.

In one example, the plurality of dies may be electrically connected by a plurality of conductors. The plurality of conductors may extend through and between the plurality of dies. Each conductor of the plurality of conductors may be electrically connected to at least one trimmable or programmable component of the plurality of dies and at least one probe pad.

According to another embodiment, there is provided a method of testing or trimming or programming a semiconductor wafer having a first die including a first integrated circuit having a trimmable or programmable component. The method includes making an electrical connection to at least one probe pad arranged on the wafer. The at least one probe pad is electrically connected to the trimmable or programmable component and is arranged outside of the first die. The method includes applying an electrical signal to the at least one probe pad to trim or permanently alter an electrical characteristic of the trimmable or programmable component.

In one example, the step of making an electrical connection to the at least one probe pad may include making an electrical connection to the at least one probe pad in a saw street of the wafer.

In one example, the method may include a step of determining an electrical characteristic of the trimmable component prior to the step of applying an electrical signal to the at least one probe pad to trim the trimmable component.

According to another embodiment, there is provided a method of testing or trimming or programming a semiconductor wafer having a first die including a first integrated circuit having a trimmable or programmable component. The method includes making an electrical connection to at least one probe pad arranged on the wafer. The at least one probe pad is electrically connected to the trimmable or programmable component and is arranged in a saw street of the semiconductor wafer. The method includes applying an electrical signal to the at least one probe pad to trim or permanently alter an electrical characteristic of the trimmable or programmable component.

In one example, the method may include a step of determining an electrical characteristic of the trimmable component prior to the step of applying an electrical signal to the at least one probe pad to trim the trimmable the component.

According to another embodiment, there is provided a probe card for testing or trimming or programming a semiconductor wafer having a first die including a first integrated circuit having a trimmable or programmable component. The probe card includes at least one probe arranged to make electrical contact with at least one probe pad arranged on the wafer. The at least one probe pad is electrically connected to the trimmable or programmable component and is arranged outside of the first die.

In one example, the at least one probe may be arranged to make electrical contact with the at least one probe pad in a saw street of the wafer.

According to another embodiment, there is provided a probe card for testing or trimming or programming a semiconductor wafer having a first die including a first integrated circuit having a trimmable or programmable component. The probe card includes at least one probe arranged to make electrical contact with at least one probe pad arranged on the wafer. The at least one probe pad is electrically connected to the trimmable or programmable component and is arranged in a saw street of the wafer.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments described herein are directed to a semiconductor wafer comprising a first die including a first integrated circuit having a trimmable or programmable component and at least one probe pad electrically connected to the trimmable or programmable component. Advantageously, the at least one probe pad is arranged outside of the first die so there is no need to increase die size to accommodate probe pads and small die size can be maintained. Furthermore, the trimmable component allows integrated circuits on the dies of the wafer to be trimmed, which increases the yield, quality and reliability of the semiconductor devices into which the integrated circuits are incorporated.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 3A:
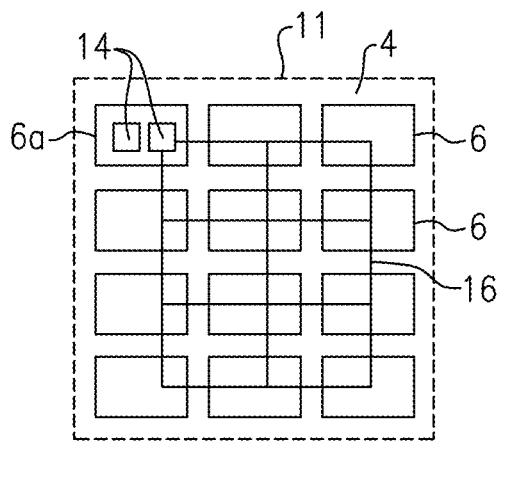
FIGS. 3A and 3B are schematic illustrations of part of a semiconductor wafer according to an embodiment, in which reticle field areas each utilize a steal primary die for wafer testing and trimming.

FIG. 3A shows a reticle field area 11 of a wafer 4 comprising twelve dies 6 arranged in a 3×4 matrix. A die 6a in the top left-hand corner of the field area 11 has been utilized as a steal primary die, into which test structures 14 have been placed. The test structures 14 are connected to the other dies 6 within the reticle field area 11 by a matrix of electrical interconnections 16, which allow the other dies 6 to be tested relative to the test structures 14 to determine whether their electrical characteristics are within permitted tolerances. The embodiment of FIG. 3A seeks to reduce amount of metal interconnections in the saw streets, which can help to make dicing of the wafer easier.

Figure 1:
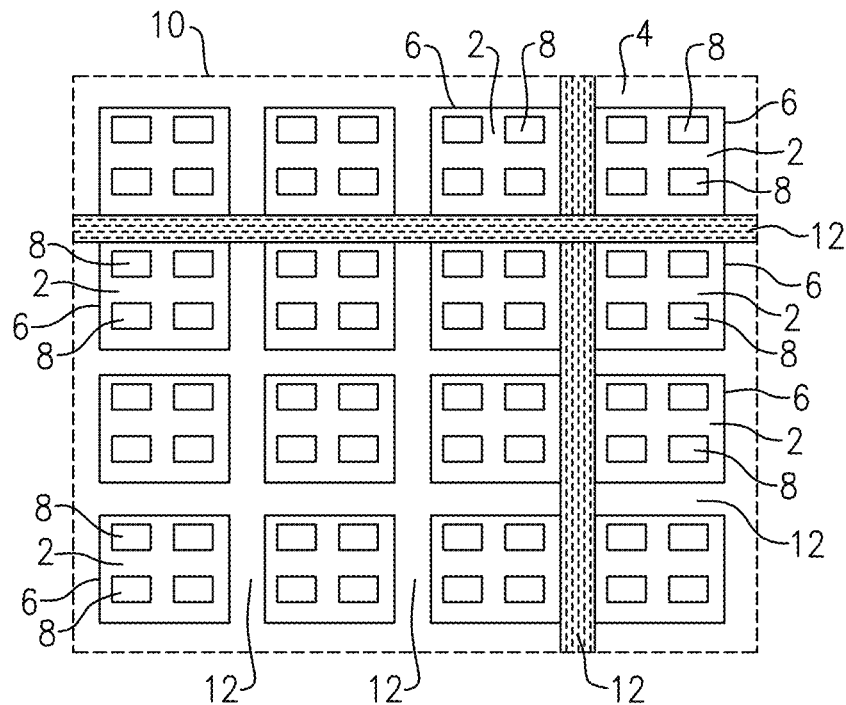
FIG. 1 is a schematic illustration of part of a known wafer arrangement including a reticle field area having a matrix of semiconductor devices.
Figure 2A:
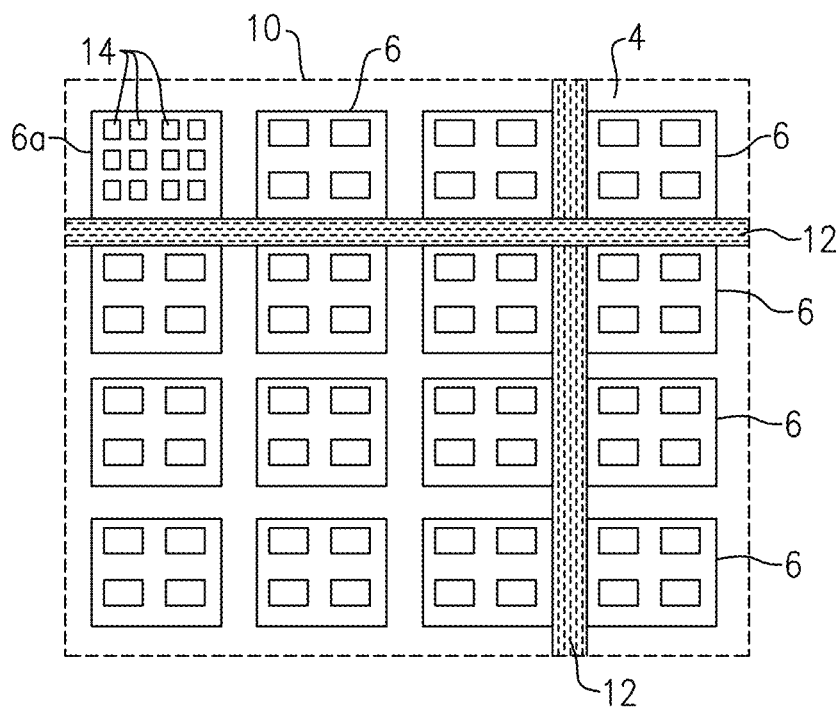
FIGS. 2A and 2B are schematic illustrations of parts of two known wafer arrangements in which reticle field areas each utilize a steal primary die for wafer testing and trimming.
Figure 2B:
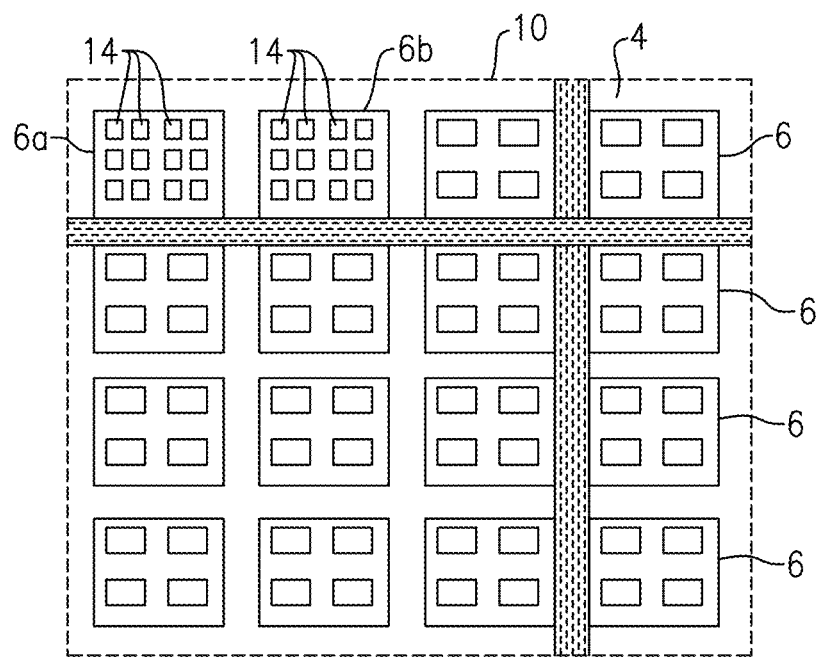
Figure 3B:
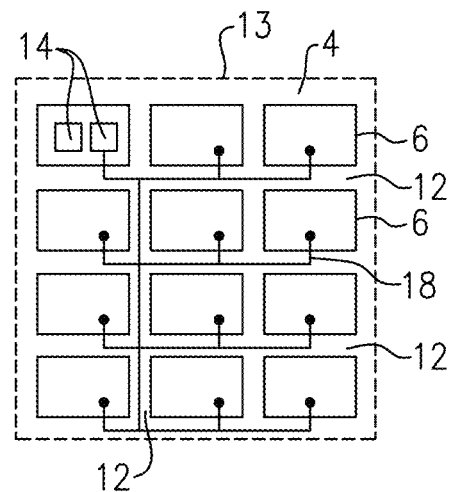

FIG. 3B shows a field area 13 of a wafer 4 comprising twelve dies 6 arranged in a 3×4 matrix in the same manner as in FIG. 2A with the exception that the test structures 14 in the steal primary die 6a are not connected to the other dies 6 by a matrix of electrical interconnections but are instead connected by electrical interconnections 18 extending along the saw streets 12. The saw streets 12 are two narrow to accommodate the test structures 14 but are wide enough to accommodate the relatively thin electrical interconnections 18.

Figure 4:
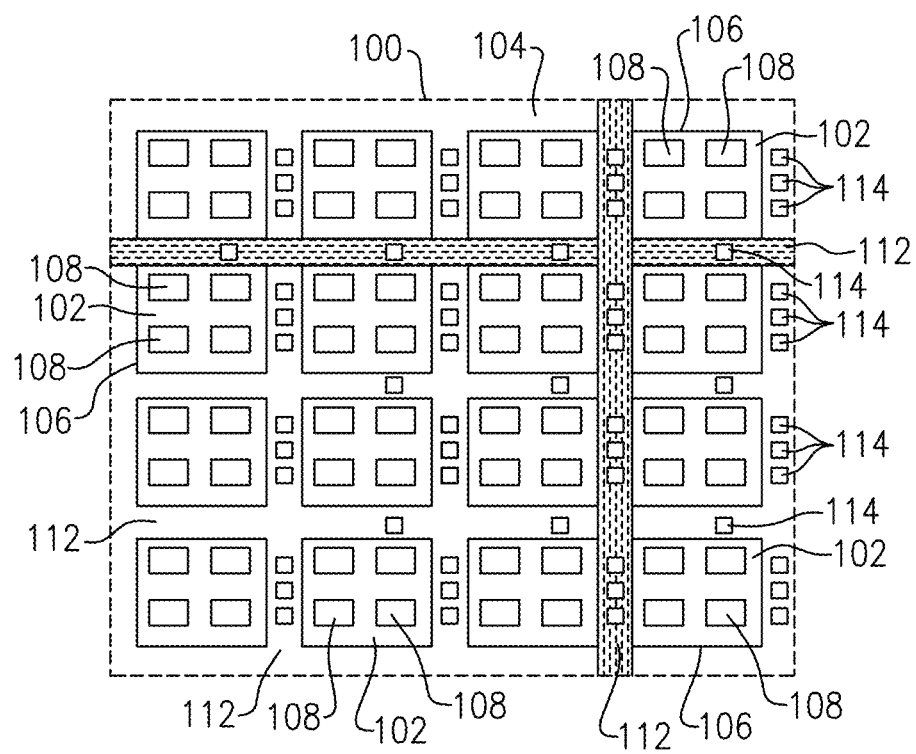
FIG. 4 is a schematic illustration of part of a semiconductor wafer according to an embodiment, the semiconductor wafer having a plurality of semiconductor devices arranged thereon.

FIG. 4 is a schematic illustration of part of a semiconductor wafer 104 according to an embodiment. The semiconductor wafer 104 has sixteen semiconductor devices 102 arranged in a 4×4 grid or matrix. The semiconductor devices 102 may be WLCSPs. The dies 106 of the semiconductor devices 102 are arranged in a reticle field area 100 that has been projected on to the wafer 104. Only the outline of the die 106 of each of the semiconductor devices 102 and the contact pads 108 for electrically connecting to the integrated circuit (not shown) of each die 106 are shown. Other components of the semiconductor devices 102 have been omitted for clarity. Four contact pads 108 per die 106 are shown but it will be appreciated that a different number of contact pads may be present depending on the nature of the integrated circuit to which they connect. It will be appreciated that the contact pads 108 will be present in the final assembled product and will be used to connect the semiconductor device 102 to a printed circuit board or to a module or other component. Although FIG. 4 shows only sixteen dies 106 within the reticle field area 100, it will be appreciated that the reticle field area 100 may contain hundreds of dies. Scribe lines or saw streets 112 are arranged between the columns and rows of dies 106 along which the semiconductor wafer 104 is cut or diced to separate the semiconductor wafer 104 into individual semiconductor devices 102 such that each semiconductor device has its own die 6 and integrated circuit (not shown). Two saw streets 112 have been highlighted with stippled shading in FIG. 4 but it will be appreciated that a saw street 112 extends between all the columns and rows of the matrix of dies 106 such that each die 106 can be separated.

Each semiconductor device 102 has a plurality of probe pads 114 arranged in the saw streets 112 adjacent to the semiconductor device 102. Each of the probe pads 114 for a particular die 106 is electrically connected by an electrical conductor (not shown) to at least one trimmable component (not shown) of the integrated circuit (not shown) formed on the die 106. The trimmable component is configured to be trimmed or permanently altered in response to an electrical signal which can be applied to one or more of the probe pads 114 by means of a probe. The trimmable component may be a fuse or a memory, such as a one-time programmable memory.

During testing or trimming probes may be applied to both the contact pads 108 and probe pads 114. Probes may be applied to one or more contact pads to, for example, apply power to the integrated circuit so that it can be tested. Probes can be applied to the probe pads to either test or trim the integrated circuit. The probe pads 114 are used solely for testing and trimming and can be located anywhere in the saw streets. The probe pads 114 are removed along with the saw streets 112 when the semiconductor wafer 104 is diced to separate out individual semiconductor devices 102.

Figure 5:
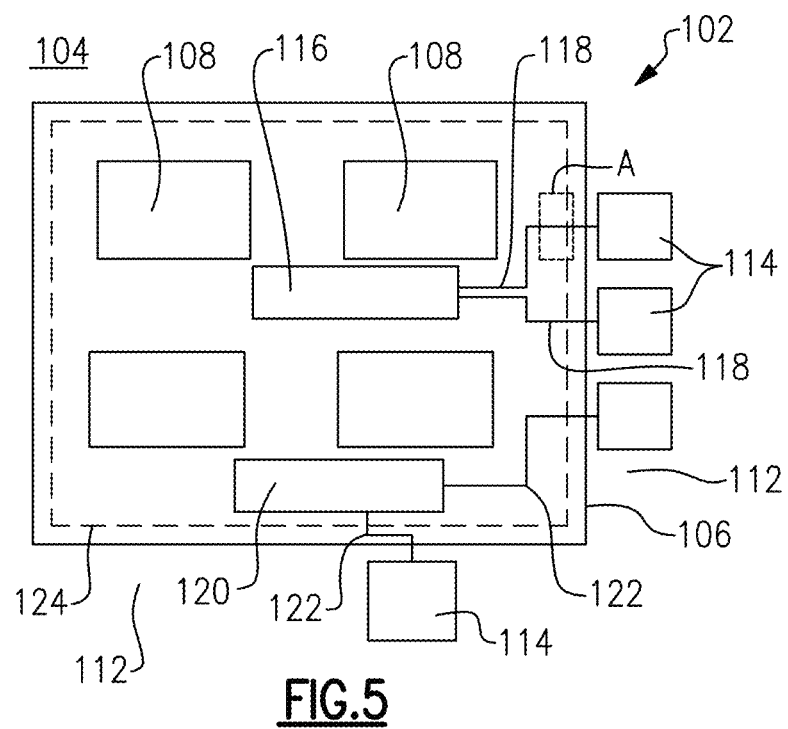
FIG. 5 is a schematic illustration of part of the semiconductor wafer of FIG. 4 showing a single semiconductor device.

FIG. 5 is a schematic illustration of part of the semiconductor wafer 104 of FIG. 4 showing a single semiconductor device 102. As discussed above with respect to FIG. 4, the semiconductor device 102 comprises a die 106 having an integrated circuit (not shown) thereon and contact pads 108 for electrically connecting to the integrated circuit. Some components of the semiconductor device 102 have been omitted for clarity. The semiconductor device 102 also comprises fuse circuitry including a fuse block 116 having a plurality of fuses (not shown). The fuse block 116 is connected to probe pads 114 located in saw streets 112 by means of conductors 118. The semiconductor device 102 further comprises trimming control circuitry including a control block 120 which can be used to control the fuse block 116 and the operation of the integrated circuit during testing and trimming. The control block 120 is connected to probe pads 114 located in saw streets 112 by means of conductors 122.

In addition, the semiconductor device 102 further comprises one or more seal rings 124 (or other crack-stop rings) around the perimeter of the semiconductor device 102. The seal ring 124 is formed between the saw streets 112 and the integrated circuit (not shown) in the region of the perimeter of the die 106. During wafer dicing, when the wafer is separated into individual semiconductor devices 102 each having its own die and integrated circuit, cracks may form in the wafer substrate due to the stress of the mechanical cutting process. The seal ring 124 prevents or substantially reduces the propagation of cracks from the saw streets 112 to the integrated circuit, which could damage the integrated circuit. The seal ring 124 also inhibits the ingress of moisture or chemicals into the integrated circuit which could also damage the integrated circuit. The seal ring 124 can be continuous or segmented. In the embodiment of FIG. 5, the seal ring 124 is segmented. Where a segmented seal ring is used, the segments of the seal ring are arranged to effectively inhibit the ingress of moisture and chemicals, as discussed in more detail below with respect to FIG. 6A. The conductors 118 pass through the seal ring 124 to connect to the probe pads 114.

Figure 6A:
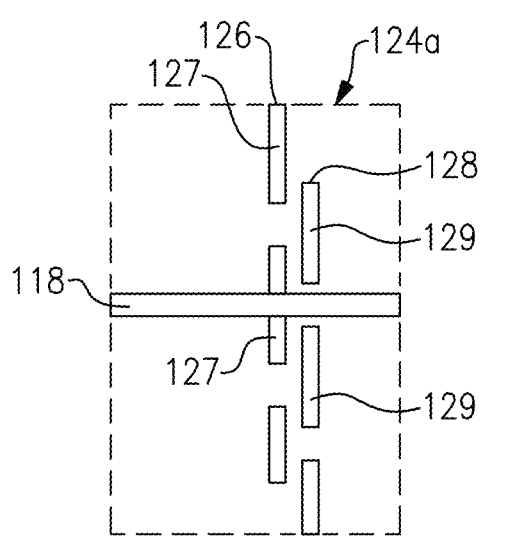
FIGS. 6A and 6B are schematic plan views of the part of the semiconductor device of FIG. 5 contained within the dashed box labelled A in FIG. 5 and show different arrangements of seal rings.
Figure 6B:
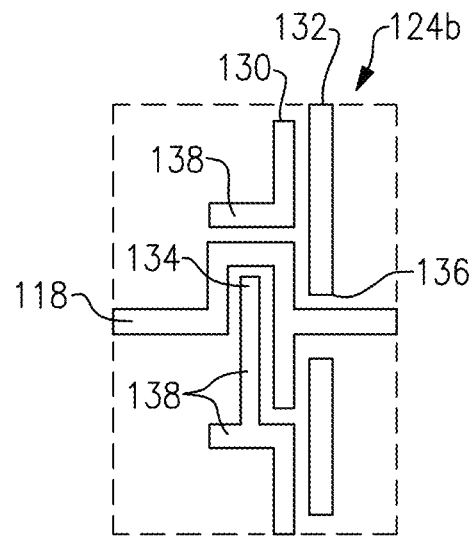

FIGS. 6A and 6B are schematic plan views of the part of the semiconductor device 102 of FIG. 5 contained within the dashed box labelled A in FIG. 5 and show different embodiments of seal rings. In the embodiment of FIG. 6A, the seal ring 124 is segmented and comprises two segmented rings; an inner segmented ring 126 including segments 127 and an outer segmented ring 128 including segments 129. The inner segmented ring 126 is spaced from the outer segmented ring 128. The segments 127 of the inner segmented ring 126 are arranged to oppose the gaps in the segments 129 of the outer segmented ring 128 such that the gaps in both the inner 126 and outer 128 segmented rings are not aligned and such that there is no direct path through the gaps in both segmented rings 126, 128. This arrangement helps to reduce the ingress of moisture and chemicals. A conductor 118 crosses over or through one segment 127 of the inner segment ring 126 and through a gap between two segments 129 of the outer segmented ring 128. The conductor 118 may be formed on a single layer of the semiconductor device 102 or multiple layers. The segments 127 and 129 of the seal ring 124 are floating or electrically isolated from other components of the semiconductor device to prevent the electrical signal in conductor 118 from being passed to other components.

In the embodiment of FIG. 6B, the seal ring 124b can be either segmented or continuous and comprises two spaced apart rings; an inner ring 130 and an outer ring 132. The inner ring 130 has a gap 134 which is offset from a gap 136 formed in the outer ring 132. A conductor 118 crosses the seal ring 124b by passing through the gap 134 in the inner ring 130 and the gap 136 in the outer ring 136. Since the gaps 134 and 136 are offset the conductor 118 is made to follow a convoluted path through the seal ring 124b, which helps to inhibit the ingress of moisture and chemicals. Furthermore, the parts of the inner ring 130 in the region of conductor 118 are provided with right-angle sections 138 to make the conductor follow a convoluted path and to reduce the size of any spaces between the conductor 118 and the inner ring 130 to help further inhibit the ingress of moisture and chemicals.

Figure 7A:
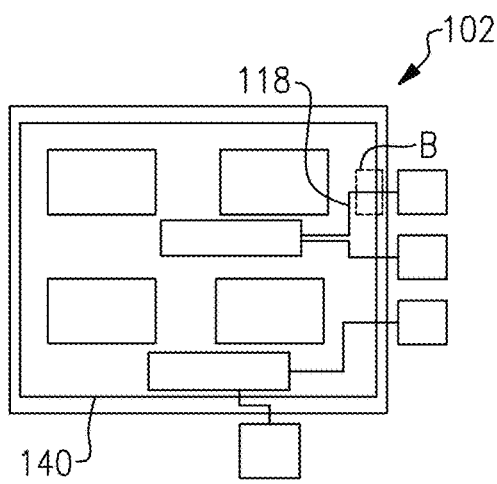
FIG. 7A is a schematic illustration of part of the semiconductor wafer of FIG. 4 showing another embodiment of a single semiconductor device.

FIG. 7A is a schematic illustration of part of the semiconductor wafer 104 of FIG. 4 showing another embodiment of a single semiconductor device 102. The semiconductor device 102 of the embodiment of FIG. 7A is identical to the semiconductor device shown in FIG. 5 with the exception that it has a continuous seal ring 140.

FIGS. 7B to 7E are schematic side views of the part of the semiconductor device of FIG. 7A contained within the dashed box labelled B in FIG. 7A and show different conductor paths through a seal ring. In each of the embodiments of FIGS. 7B to 7E, the seal ring 140 comprises three stacked metal layers 142a to 142c. Vias 143 are arranged between the metal layers 142a to 142c.

Figure 7B:
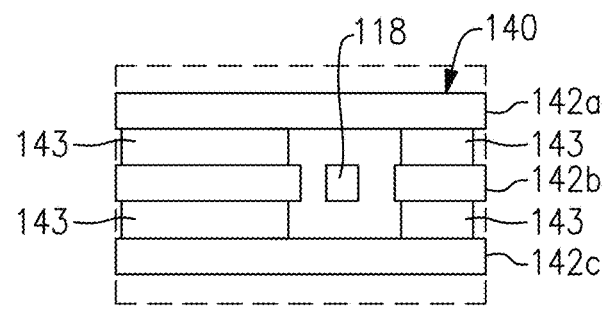
FIGS. 7B, 7C, 7D, and 7E are schematic side views of the part of the semiconductor device of FIG. 6A contained within the dashed box labelled B in FIG. 7A and show different conductor paths through a seal ring.
Figure 7C:
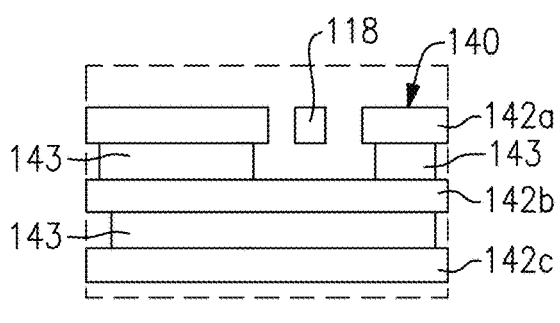
Figure 7D:
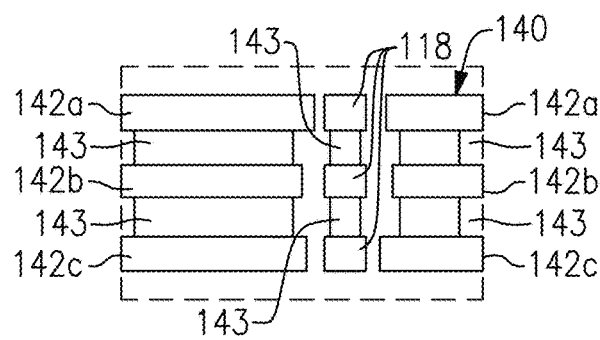

In the embodiment of FIG. 7B, a conductor 118, which connects fuse circuitry or control circuitry on the die to a probe pad located in a saw street, passes through a gap formed in the middle layer 142b of the three stacked metal layers 142a to 142c. In the embodiment of FIG. 7C, the conductor 118 passes through a gap formed in the top layer 142a of the three stacked metal layers 142a to 142c. In the embodiments of FIGS. 7B and 7C, the conductor 118 has a height equal to the height of one metal layer, i.e. the height of the metal layer it passes through. In the embodiment of FIG. 7D, there are three stacked conductors 118, i.e. one conductor 118 for each of the stacked metal layers 142a to 142c, and the conductors 118 pass through the full height of all three metal layers 142a to 142c.

In each of the embodiments of FIGS. 7B to 7D, the conductor 118 passes through the seal ring 140 without touching any of the metal layers 142a to 142c. This avoids the electrical signal in the conductor propagating to other parts of the semiconductor device and avoids the seal ring 140 electrically shorting the multiple conductors of the semiconductor device which pass through the seal ring 140.

Figure 7E:
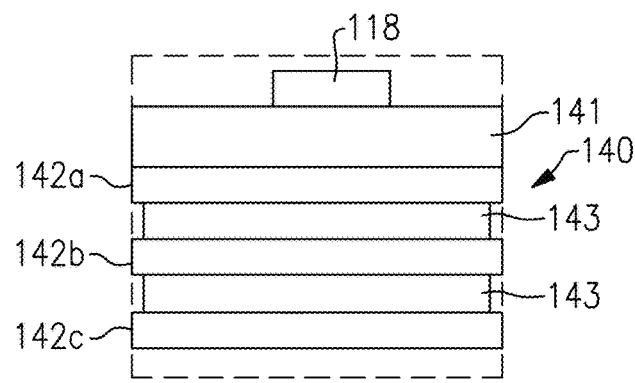

FIG. 7E shows a different conductor path through the seal ring 140. In the embodiment of FIG. 7E the conductor 118 is formed as part of a conductive redistribution layer (RDL) trace of the semiconductor device. The redistribution layer is applied after wafer processing, which includes the addition of a passivation or insulating layer 141 on top of the semiconductor device. The RDL trace is applied on top of the seal ring 140 to connect the internal circuitry to the probe pads in the saw street.

Figure 8:
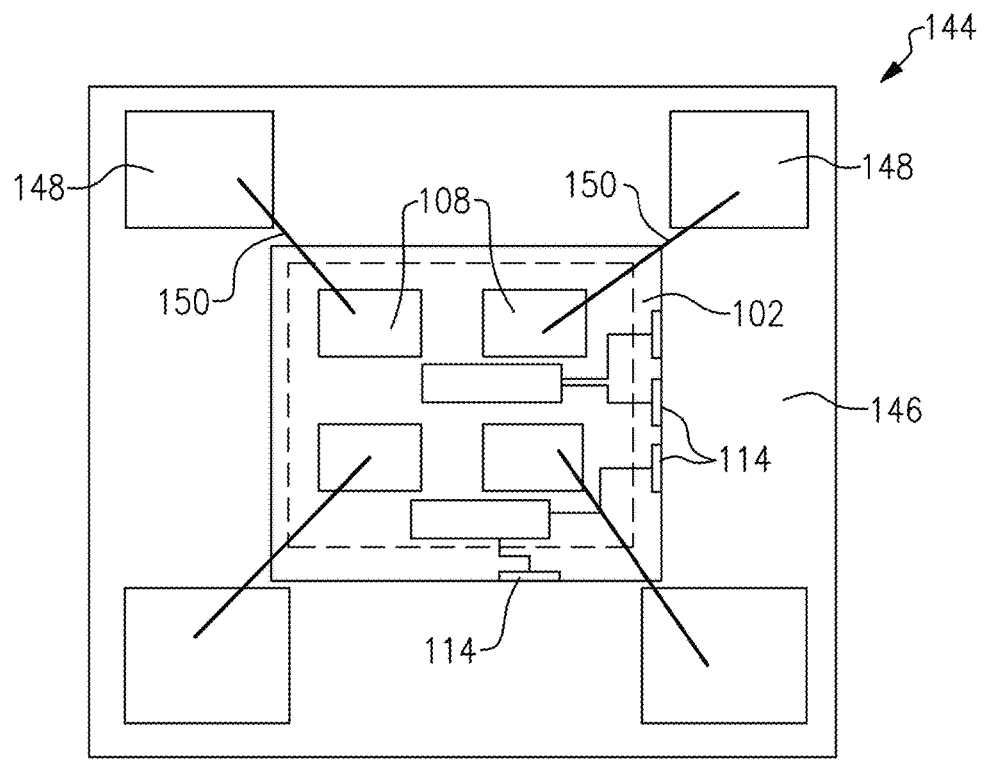
FIG. 8 is a schematic illustration of a multichip module including a semiconductor device that has been separated from a wafer and mounted within the multichip module.

FIG. 8 is a schematic illustration of a multichip module 144 that includes a semiconductor device 102 that has been separated from a wafer. The multichip module 144 comprises a substrate 146 upon which the semiconductor device 102 is mounted. The semiconductor device 102 is the same as the semiconductor device 102 of FIG. 5. The contact pads 108 of the semiconductor device 102 are connected to bonding pads 148 of the multichip module 144 by means of bonding wires 150. It will be appreciated that multichip modules may comprise a plurality of semiconductor devices and integrated circuits, although these are not shown in the multichip module 144 of FIG. 8. It will be appreciated that, instead of multichip module 144, other types of chip assembly such as a flip-chip could also be used.

In situations where the dicing blade is narrower than the saw streets on the wafer or is not fully aligned with the saw streets, there is potential for not all of the structures in the saw streets such as the probe pads and any supplemental circuit to not be fully removed upon dicing of the wafer. As can be seen in FIG. 8, the semiconductor device 102 includes some remnants of the probe pads 114 following dicing. However, these probe pads will be electrically isolated in the final assembled product, for example, when mounted within the multichip module of FIG. 8, and therefore will not adversely affect the performance of the semiconductor device 102.

Figures 9A, 9B:
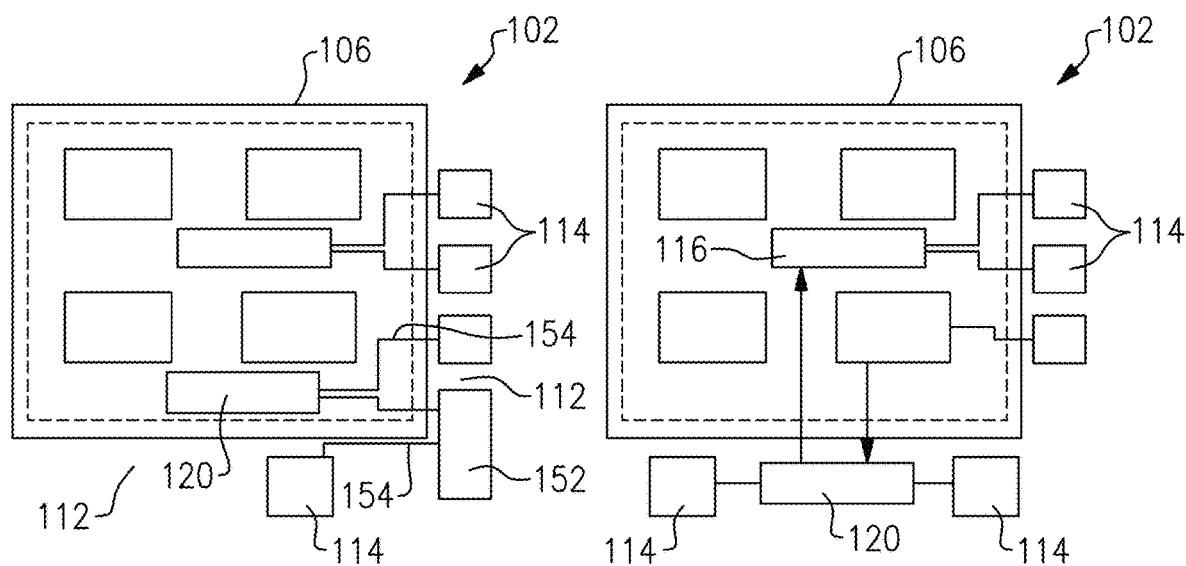
FIGS. 9A and 9B are schematic illustrations of part of the semiconductor wafer of FIG. 4 showing different embodiment of a single semiconductor device.

FIG. 9A is a schematic illustration of part of the semiconductor wafer of FIG. 4 showing another embodiment of a single semiconductor device 102. The semiconductor device 102 of the embodiment of FIG. 9A is identical to the semiconductor device shown in FIG. 5 with the exception that supplemental circuitry 152 has been included in one of the saw streets 112 adjacent to the semiconductor device 102. In the embodiment of FIG. 9A, the supplemental circuitry 152 is electrically connected to the control block 120 arranged on the die 106 of the semiconductor device 102 and to a probe pad 114 by means of conductors 154. However, the supplemental circuitry 152 may or may not be connected to the die 106. The supplemental circuitry 152 may include any circuitry which is not needed on the die in the final assembled product, for example, process shift control circuitry, ring or RC oscillators and fuse blowing circuitry. Indeed, any component or circuit that is only needed during testing or trimming of the semiconductor device can be located in the saw streets. This means that the size of dies can be kept small.

FIG. 9B is a schematic illustration of part of the semiconductor wafer of FIG. 4 showing another embodiment of a single semiconductor device 102 in which all the components that are only needed during testing or trimming have been located in the saw streets. The semiconductor device 102 of the embodiment of FIG. 9B is identical to the semiconductor device shown in FIG. 5 with the exception that control block 120 has been included in one of the saw streets 112 adjacent to the semiconductor device 102.

Figure 10B:
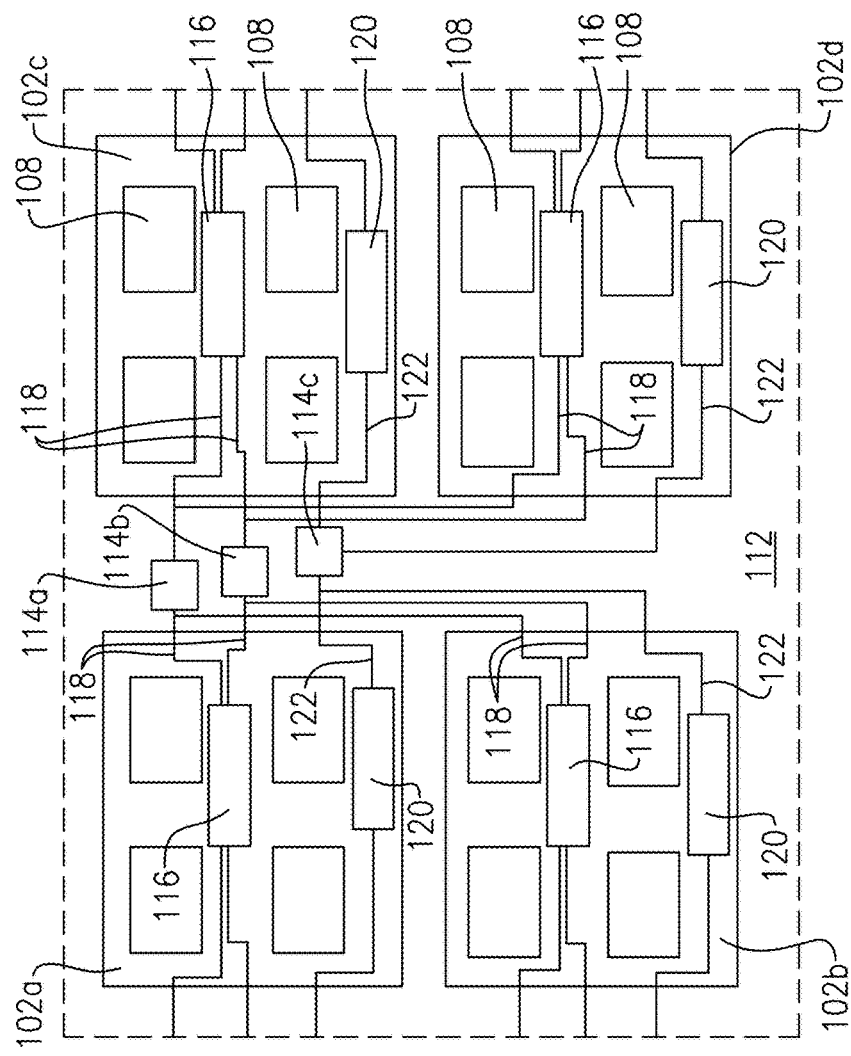
FIGS. 10A, 10B, and 10C are schematic illustrations of different arrangements for connecting probe pads to multiple dies.
Figure 10A:
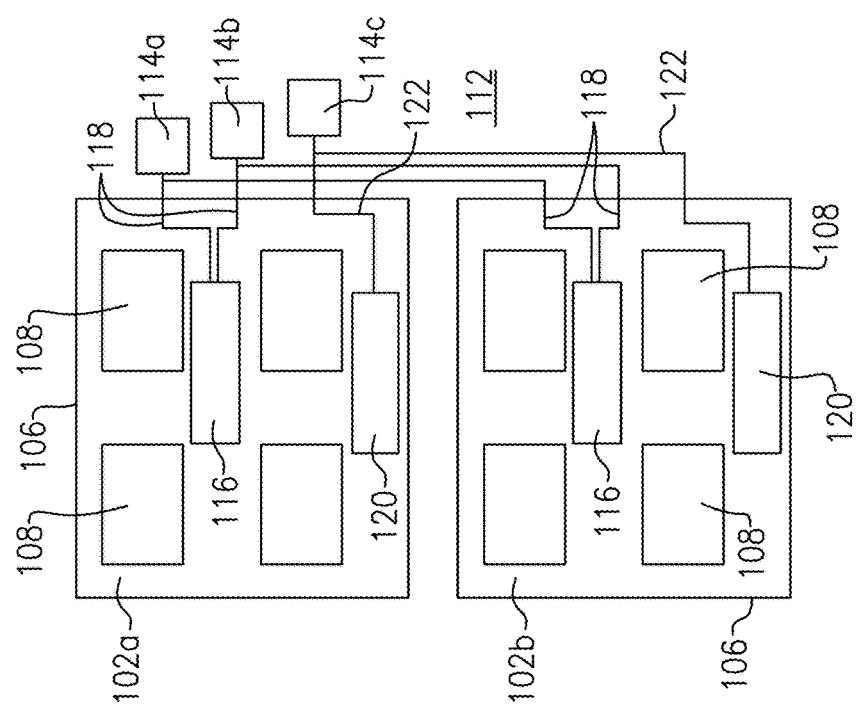
Figure 10C:
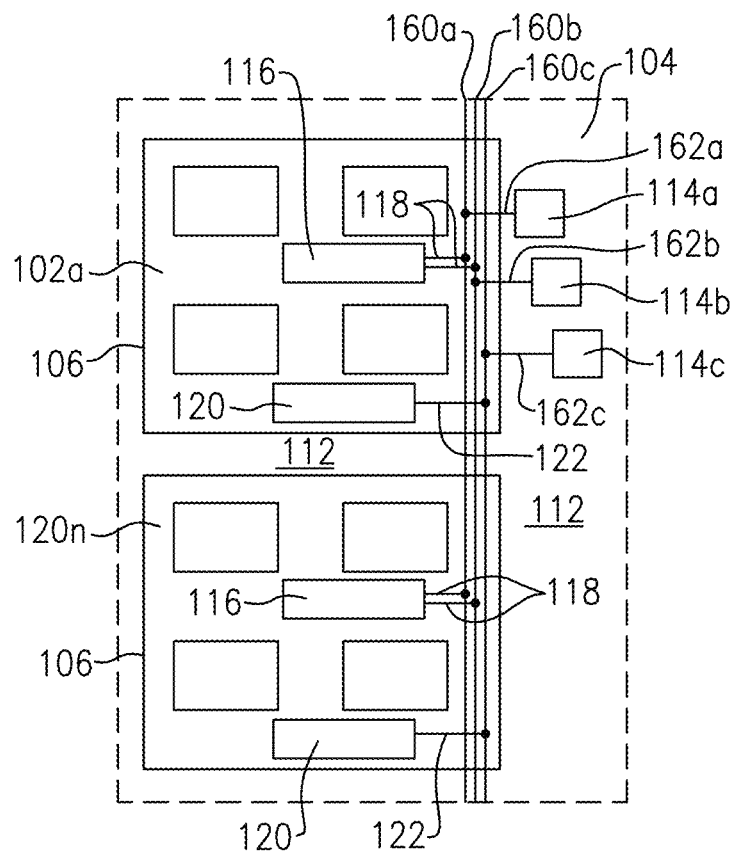

FIGS. 10A to 10C are schematic illustrations of different arrangements for connecting probe pads to multiple dies. FIG. 10A shows an arrangement for connecting probe pads 114a to 114c to two semiconductor devices 102a and 102b. However, it will be appreciated that this arrangement could be used to connect probe pads to many more semiconductor devices. The semiconductor devices 102a and 102b have a similar design to the semiconductor device shown in FIG. 5 and each semiconductor device 102a, 102b comprises a die 106 having an integrated circuit (not shown) thereon and contact pads 108 for electrically connecting to the integrated circuit. Some components of the semiconductor devices 102 have been omitted for clarity. Each semiconductor device 102 also comprises fuse circuitry including a fuse block 116 having a plurality of fuses (not shown). The fuse blocks 116 of both semiconductor devices 102a and 102b are connected to probe pad 114a located in saw street 112 by means of conductors 118. Therefore, the probe pad 114a can be used to pass an electrical signal to the fuse block 116 of both semiconductor devices 102a and 102b. Similarly, the fuse blocks 116 of both semiconductor devices 102a and 102b are connected to probe pad 114b by means of conductors 118. Therefore, the probe pad 114b can be used to pass an electrical signal to a different element of the fuse block 116 of both semiconductor devices 102a and 102b to that controlled by probe pad 114a.

The semiconductor device 102 further comprises control circuitry including a control block 120 which can be used to control the fuse block 116 and the operation of the integrated circuit during testing and trimming. The control blocks 120 of both semiconductor devices 102a and 102b are connected to probe pad 114c located in saw street 112 by means of conductors 122. Therefore, the probe pad 114c can be used to control the control block 120 of both semiconductor devices 102a and 102b. During testing and trimming, probes could additionally be applied to one or more of contact pads 108 in each of semiconductor devices 102a and 102b to, for example, provide power to the integrated circuit being tested.

The probe pads 114a to 114c are located adjacent to semiconductor device 102a. The conductors 118 and 122 that extend from semiconductor device 102b to the probe pads 114a to 114c are arranged in the saw street 112. This arrangement reduces the number of probe pads that need to be added to the wafer for testing and trimming. This arrangement is also useful for multi-die testing, i.e. testing multiple dies simultaneously. Probe pads 114a to 114c and the portions of conductors 118 and 122 located in the saw street 112 are removed when the wafer is diced.

FIG. 10B shows an arrangement for connecting probe pads 114a to 114c to four semiconductor devices 102a to 102d. However, it will be appreciated that this arrangement could be used to connect probe pads to many more semiconductor devices. Each of the semiconductor devices 102a to 102d in the arrangement of FIG. 10B has the same components as semiconductor devices 102a and 102b in FIG. 10A. In the arrangement of FIG. 10B, the fuse blocks 116 of all four semiconductor devices 102a to 102d are connected to probe pad 114a located in saw street 112 by means of conductors 118. Therefore, the probe pad 114a can be used to pass an electrical signal to the fuse block 116 of all four semiconductor devices 102a to 102d. Similarly, the fuse blocks 116 of all four semiconductor devices 102a to 102d are connected to probe pad 114b by means of conductors 118. Therefore, the probe pad 114b can be used to pass an electrical signal to a different element of the fuse block 116 of all four semiconductor devices 102a to 102d to that controlled by probe pad 114a.

The control blocks 120 of all four semiconductor devices 102a to 102d are connected to probe pad 114c located in saw street 112 by means of conductors 122. Therefore, the probe pad 114c can be used to control the control block 120 of all four semiconductor devices 102a to 102d. As in the arrangement of FIG. 10A, probes could additionally be applied to one or more of contact pads 108 in each of semiconductor devices 102a and 102b to, for example, provide power to the integrated circuit during testing and trimming. This arrangement also reduces the number of probe pads that need to be added to the wafer for testing and trimming. This arrangement is also useful for multi-die testing. Probe pads 114a to 114c and the portions of conductors 118 and 122 located in the saw street 112 are removed when the wafer is diced.

FIG. 10C shows an arrangement for connecting probe pads 114a to 114c to multiple semiconductor devices 102a to 102n arranged on a wafer 104. Although only two semiconductor devices are shown in FIG. 10C, it will be appreciated that this arrangement could be used to connect probe pads to a number of semiconductor devices, i.e. semiconductor devices 102a to 102n. It could also be used to connect multiple semiconductor devices in two dimensions, i.e. multiple semiconductor devices arranged in a matrix or grid. Each of the semiconductor devices 102a to 102n in the arrangement of FIG. 10C has the same components as semiconductor devices 102a and 102b in FIG. 10A. The wafer 104 has a plurality of conductors 160a to 160c; there is one conductor 160a to 160c for each of probe pads 114a to 114c. The conductors 160a to 160c extend in parallel in a line along the column (vertically in FIG. 10C) of semiconductor devices 102a to 102n and pass within the boundary of the dies 106 adjacent one edge of the dies 106. The conductors 160a to 160c pass over the saw streets 112 in between the dies 106 and therefore interconnect each of the dies 106 in the column of semiconductor devices 102a to 102n.

The fuse blocks 116 of each of the semiconductor devices 102a to 102n are connected by means of conductors 118 to conductor 160a, which in turn is connected to probe pad 114a located in saw street 112 by means of conductor 162a. Therefore, probe pad 114a represents a common probe point for testing or trimming all components connected to conductor 162a and can be used to pass an electrical signal to the fuse block 116 of each of the semiconductor devices 102a to 102n. Similarly, the fuse blocks 116 of each of the semiconductor devices 102a to 102n are connected by means of conductors 118 to conductor 160b, which in turn is connected to probe pad 114b by means of conductor 162b. Therefore, probe pad 114b represents a common probe point for testing or trimming all components connected to conductor 162b and can be used to pass an electrical signal to a different element of the fuse block 116 of each of the semiconductor devices 102a to 102n to that controlled by probe pad 114a. As discussed above, conductors 160a to 160c are not in the saw street 112 but instead are located within the boundary of the dies 106 and are therefore not removed when the wafer 104 is diced. However, the conductors 160a to 160c are electrically isolated once the wafer 104 is diced and therefore there is no adverse impact on the performance of the semiconductor devices 102a to 102n of retaining portions of the conductors 160a to 160c on the dies 106.

The control blocks 120 of each of the semiconductor devices 102a to 102n are connected by means of conductors 122 to conductor 160c, which in turn is connected to probe pad 114c located in saw street 112 by means of conductor 162c. Therefore, probe pad 114c represents a common probe point for testing or trimming all components connected to conductor 162c can be used to control the control block 120 of each of the semiconductor devices 102a to 102n. As in the arrangements of FIGS. 10A and 10B, probes could additionally be applied to one or more of contact pads 108 in each of semiconductor devices 102a to 102n to, for example, provide power to the integrated circuit during testing and trimming. This arrangement also reduces the number of probe pads that need to be added to the wafer for testing and trimming. This arrangement is also useful for multi-die testing. The probe pads 114a to 114c located in the saw street 112 are removed when the wafer is diced.

Figure 11:
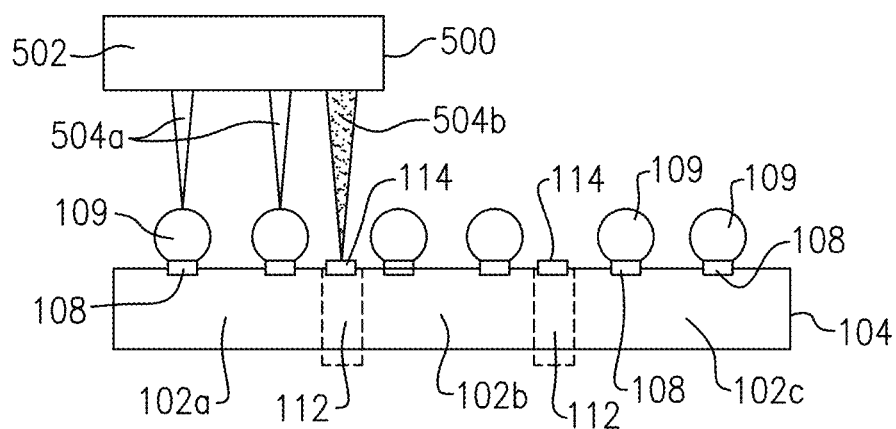
FIG. 11 is a schematic illustration of a probe pad for testing a bumped semiconductor wafer according to an embodiment.

FIG. 11 is a schematic illustration of a probe card 500 for testing a bumped semiconductor wafer 104 according to an embodiment in which probe pads 114 are located in the saw streets 112, for example, the embodiment of the semiconductor wafer 104 of FIG. 4 or 5. The wafer 104 is shown comprising three semiconductor devices 102a to 102c, although it will be appreciated that, in reality, the wafer will comprise many more semiconductor devices. Each of semiconductor devices 102a to 102c is a wafer-level chip scale package (WLCSP) and substantially all of the components of the semiconductor devices 102a to 102c have been fully assembled on the wafer 104 prior to the wafer being diced. Each of semiconductor devices 102a to 102c has contact pads 108 for electrically connecting to its integrated circuit arranged on the die (not shown). Solder bumps 109 have been added to the contact pads to facilitate connecting the semiconductor devices 102a to 102c to printed circuit boards or other packages.

The probe card 500 comprises a support 502 which carries a plurality of probes 504a and 504b. Probes 504a are arranged to make contact with the solder bumps 109 arranged on contact pads 108, whereas probe 504b is longer than probes 504a to enable it to contact probe pad 114 arranged in the saw streets 112 of wafer 104, which probe pad 114 is lower than the levels of the tops of the solder bumps 109. Applying probes 504a to the solder bumps 109 instead of directly to the contact pads 108 can be advantageous because it reduces the risk of damage to the contact pads 108. It is also desirable, and more cost effective, to perform trimming or programming and testing once the semiconductor devices 102a to 102c have been fully assembled, particularly after the addition of redistribution layers (not shown) and solder bumps 109, because these components can affect device operation, function or performance. Probes 504a may be used to provide a supply voltage or a control signal to semiconductor device 102a, which is the device under test, whilst probe 504b used to perform a test of a trimmable component (not shown) of the integrated circuit on semiconductor device 102a and trim the trimmable component as required. Once semiconductor device 102a has been tested and trimmed, the probe card 500 can be stepped across to test the next device, i.e. semiconductor device 102b. The probe pads 114 are removed when the wafer is diced along saw streets 112.

Figure 12:
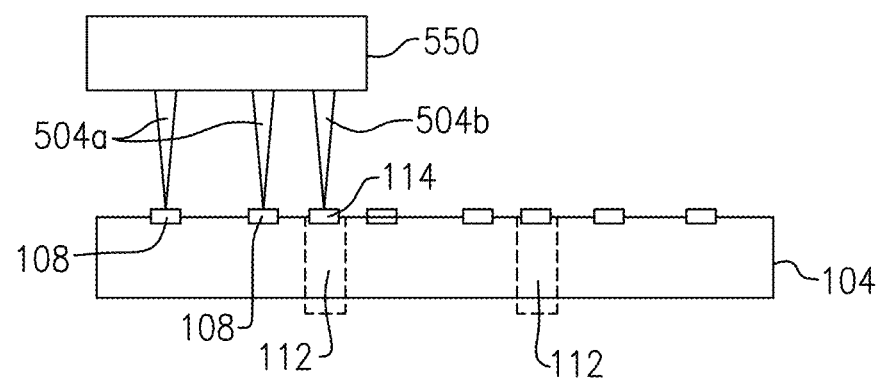
FIG. 12 is a schematic illustration of a probe pad for testing an unbumped semiconductor wafer according to an embodiment.

FIG. 12 is a schematic illustration of a probe card 550 for testing an unbumped semiconductor wafer 104 according to an embodiment in which probe pads 114 are located in the saw streets 112, for example, the embodiment of the semiconductor wafer 104 of FIG. 4 or 5. The probe card 550 is identical to the probe card 500 of FIG. 11 with the exception that the probes 554a for making contact with the contact pads 108 on the wafer 104 and probe 504b for contacting probe pad 114 arranged in the saw street 112 of wafer 104 are the same length because the contact pads 108 and probe pad 114 are at the same height or level. There is no longer any need to account for the different heights of the solder bumps 109 as shown in the arrangement of FIG. 11.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

The invention claimed is:
1. A semiconductor wafer comprising:
  a first die including a first integrated circuit having a trimmable or programmable component, the trimmable or programmable component being configured to be trimmed or permanently altered in response to an electrical signal;
  a saw street arranged adjacent to the first die;

at least an inner seal ring and an outer seal ring around the first die, the inner seal ring having a first plurality of sections and a first plurality of gaps with at least a portion of the first plurality of sections having right angles, and the outer seal ring having a second plurality of sections with a second plurality of gaps that are offset from the first plurality of gaps; and at least one probe pad electrically connected to the trimmable or programmable component, the at least one probe pad being arranged in the saw street with a conductor that follows a convoluted path through the first and second plurality of gaps in the inner and outer seal rings.

2. The semiconductor wafer of claim 1 further comprising a second die, the first and second dies being separated by the saw street.

3. The semiconductor wafer of claim 1 wherein the at least one probe pad is electrically connected to the trimmable or programmable component by a conductor extending from the at least one probe pad to the trimmable or programmable component.

4. The semiconductor wafer of claim 1 wherein the trimmable or programmable component is a fuse or a one-time programmable device.

5. The semiconductor wafer of claim 1 wherein the trimmable or programmable component is a memory.

6. The semiconductor wafer of claim 2 wherein the first die further includes trimming control circuitry configured to control trimming of the trimmable or programmable component.

7. The semiconductor wafer of claim 6 wherein the trimming control circuitry is arranged in the saw street.

8. The semiconductor wafer of claim 1 wherein the inner seal ring and the outer seal ring are arranged around the first integrated circuit between the first integrated circuit and a perimeter of the first die.

9. The semiconductor wafer of claim 1 wherein the first plurality of sections having right angles reduce spacing size between the conductor and the inner seal ring.

10. The semiconductor wafer of claim 1 wherein the first plurality of sections having right angles further inhibit ingress of moisture and chemicals into the first die.

11. The semiconductor wafer of claim 1 wherein the second plurality of gaps are offset from the first plurality of gaps to oppose the first plurality of gaps.

12. The semiconductor wafer of claim 1 wherein the conductor is formed on a single layer of the semiconductor wafer.

13. The semiconductor wafer of claim 1 wherein the inner seal ring and the outer seal ring are electrically isolated from other components of the semiconductor wafer.

14. The semiconductor wafer of claim 1 wherein the conductor is formed on multiple layers of the semiconductor wafer.

15. The semiconductor wafer of claim 1 further comprising one or more RC oscillators in the saw street that are electrically connected to the at least one probe pad.

16. The semiconductor wafer of claim 1 further comprising:
a plurality of dies separated by at least one saw street, each die of the plurality of dies including an integrated circuit having at least one trimmable or programmable component; and
a plurality of probe pads arranged in the at least one saw street, at least one probe pad of the plurality of probe pads being electrically connected to at least one trimmable or programmable component of more than one die.

17. The semiconductor wafer of claim 16 wherein the at least one probe pad of the plurality of probe pads is electrically connected to the at least one trimmable or programmable component of another die by a second conductor.

18. The semiconductor wafer of claim 16 wherein at least a portion of the first and second conductors extend along the at least one saw street to interconnect each die.

19. A method of testing or trimming or programming a semiconductor wafer having a first die including a first integrated circuit having a trimmable or programmable component, the method comprising:
making an electrical connection to at least one probe pad arranged on the semiconductor wafer having a plurality of dies, the at least one probe pad being electrically connected to the trimmable or programmable component and being arranged in a saw street of the semiconductor wafer, the electrical connection including a conductor that follows a convoluted path through a first plurality of gaps between a first plurality of segments in an outer seal ring, the convoluted path passing through a second plurality of gaps between a second plurality of right-angle sections in an inner seal ring to at least one of the plurality of dies; and
applying an electrical signal to the at least one probe pad to trim or permanently alter an electrical characteristic of the trimmable or programmable component.

20. The method of claim 19 further including a step of determining an electrical characteristic of the trimmable or programmable component prior to the step of applying an electrical signal to the at least one probe pad.

* * * * *